(12) United States Patent
Cheng et al.

(10) Patent No.: US 8,624,361 B1
(45) Date of Patent: Jan. 7, 2014

(54) SELF-FORMATION OF HIGH-DENSITY DEFECT-FREE AND ALIGNED NANOSTRUCTURES

(71) Applicant: International Business Machines Corporation, Armonk, NY (US)

(72) Inventors: Cheng-Wei Cheng, White Plains, NY (US); Jeehwan Kim, White Plains, NY (US); Hongsik Park, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/677,863

(22) Filed: Nov. 15, 2012

Related U.S. Application Data

(63) Continuation of application No. 13/670,921, filed on Nov. 7, 2012.

(51) Int. Cl.
*H01L 29/06* (2006.01)
(52) U.S. Cl.
USPC .......................................... 257/622; 977/762
(58) Field of Classification Search
USPC .......................................... 257/622; 977/762
See application file for complete search history.

(56) References Cited

U.S. PATENT DOCUMENTS

| | | | |
|---|---|---|---|
| 6,121,118 A | 9/2000 | Jin et al. | |
| 6,830,990 B1 | 12/2004 | Honer et al. | |
| 6,933,212 B1 | 8/2005 | Lee et al. | |
| 7,595,543 B2 | 9/2009 | Weber et al. | |
| 7,843,041 B2 * | 11/2010 | Kodaira et al. | 257/622 |
| 7,875,500 B2 * | 1/2011 | Inada et al. | 438/113 |
| 2009/0117741 A1 | 5/2009 | Heath et al. | |
| 2012/0148799 A1 | 6/2012 | Patolsky et al. | |

OTHER PUBLICATIONS

Li, Y., et al. "Progress Toward Nanowire Deivce Assembly Technology" "Nanowires" edited by P. Prete, Intech. Mar. 2010. pp. 373-394.
Long, Y., et al. "Recent Advances in Large-Scale Assembly of Semiconducting Inorganic Nanowires and Nanofibers for Electronics, Sensors and Photovoltaics" Chem. Soc. Rev., vol. 41. Jul. 2012. pp. 4560-4580.
San Paulo, A., et al. "Suspended Mechanical Structures Based on Elastic Silicon Nanowire Arrays" Nano Letters, vol. 7, No. 4. Mar. 2007. pp. 1100-1104.
Tamboli, A., et al. "Wafer-Scale Growth of Silicon Microwire Arrays for Photovoltaics and Solar Fuel Generation" IEEE Journal of Photovoltaics, vol. 2, Issue 3. Jul. 2012. pp. 294-297.

* cited by examiner

*Primary Examiner* — Bradley K Smith
(74) *Attorney, Agent, or Firm* — Tutunjian & Bitetto, P.C.; Louis J. Percello

(57) ABSTRACT

A device and method for forming nanostructures includes providing a monocrystalline semiconductor layer on a flexible substrate and stressing the substrate in accordance with a crystal cleave plane to initiate cracks in the semiconductor layer. The cracks are propagated on the crystal cleave plane through the semiconductor layer where the cracks are spaced by an intercrack distance as determined by applying a particular strain. The strain is released to provide parallel structures on the flexible substrate.

22 Claims, 4 Drawing Sheets

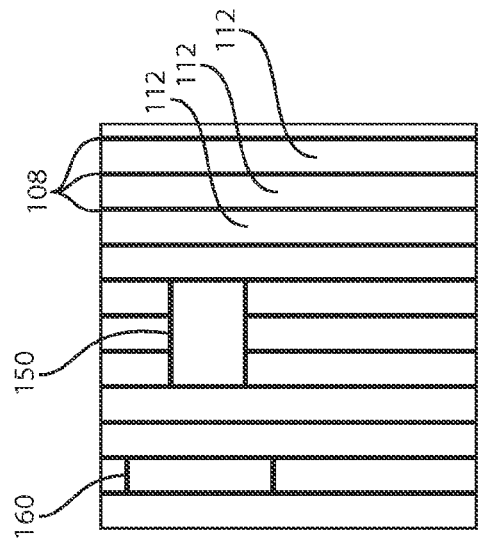
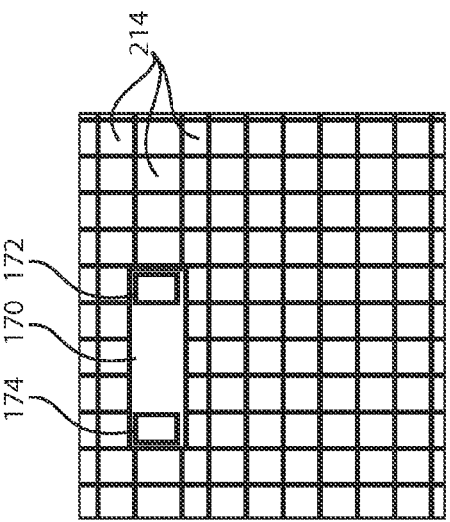
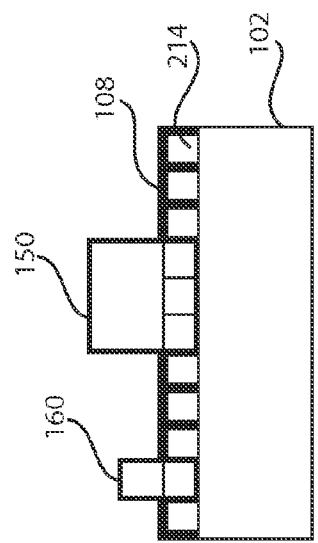
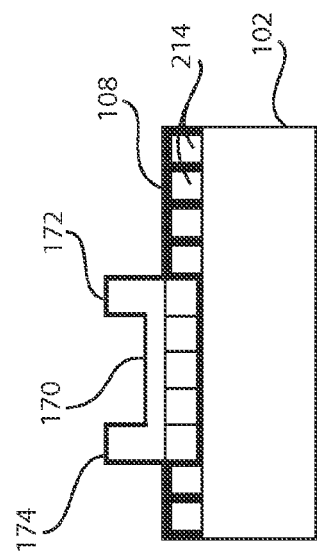

SELF-FORMATION OF HIGH-DENSITY DEFECT-FREE AND ALIGNED NANOSTRUCTURES

RELATED APPLICATION INFORMATION

This application is a Continuation application of co-pending U.S. patent application Ser. No. 13/670,921 filed on Nov. 7, 2012, incorporated herein by reference in its entirety.

BACKGROUND

1. Technical Field

The present invention relates to semiconductor devices and fabrication, and more particularly to methods and devices having nanowires or nanodots formed by stress-induced cracking.

2. Description of the Related Art

Nanowires are fabricated to increase surface area relative to volume in many applications, such as, in applications where absorption of radiation is of interest. Conventional methods for fabricating nanowires (NWs) may include different forms of lithography (e.g., E-beam lithography, photolithography, etc.). While effective, these processes are expensive and difficult to control, especially for sizes less than 20 nm. In addition to being cost-inefficient, lithography is extremely low throughput and prone to line-edge roughness, which results in a large scattering effect for carrier transport. Also, damage from dry etching processes leads to surface defects in the nanowires.

Another process includes VLS (vapor-liquid-solid) growth. VLS growth suffers from many issues, e.g., it is difficult to control the density of the nanowires and there is no alignment among the nanowires. In addition, VLS growth results in poor uniformity of material properties (dimensions and crystallinity). The nanowires are random and vertical, and the crystal quality is less than a Czochralski (CZ) single crystal, which leads to high defect density.

SUMMARY

A device and method for forming nanostructures includes providing a monocrystalline semiconductor layer on a flexible substrate and stressing the substrate in accordance with a crystal cleave plane to initiate cracks in the semiconductor layer. The cracks are propagated on the crystal cleave plane through the semiconductor layer where the cracks are spaced by an intercrack distance as determined by applying a particular strain. The strain is released to provide parallel structures on the flexible substrate.

Another method for forming nanostructures includes providing a monocrystalline semiconductor layer on a flexible substrate; bending the substrate in accordance with a first crystal cleave plane to provide a first strain in the semiconductor layer; bending the substrate in accordance with a second crystal cleave plane to provide a second strain in the semiconductor layer; propagating cracks on the first and second crystal cleave planes through the semiconductor layer where the cracks are spaced by an intercrack distance as determined by applying a particular strain; releasing the strain to provide dot structures on the flexible substrate.

Yet another method for forming nanostructures includes providing a monocrystalline semiconductor layer on a flexible substrate; bending the substrate in accordance with a crystal cleave plane to provide a strain in the semiconductor layer; propagating cracks on the crystal cleave plane through the semiconductor layer where the cracks are spaced by an intercrack distance as determined by applying a particular strain computed to provide a dimension for the parallel structures that is equal to the intercrack distance; releasing the strain to provide parallel structures on the flexible substrate; oxidizing the parallel structures to passivate and isolate adjacent parallel structures; doping the semiconductor layer; and forming an electronic device or photonic device on the parallel structures.

A nanostructure device includes a flexible substrate; a monocrystalline semiconductor layer formed on the flexible substrate and a plurality of parallel cracks formed in accordance with a crystal cleave plane in the semiconductor layer, the cracks being spaced apart by an intercrack distance as determined by applying a particular strain to form parallel structures. A dielectric material is formed in the cracks between and over the parallel structures on the semiconductor layer.

Another nanostructure device includes a flexible substrate; a monocrystalline semiconductor layer formed on the flexible substrate; and a plurality of parallel cracks formed in accordance with two crystal cleave planes in the semiconductor layer. The cracks are spaced apart by intercrack distances in two dimensions as determined by applying a particular strain to form dot structures. A dielectric material is formed in the cracks between and over the dot structures on the semiconductor layer.

Yet another nanostructure device includes a flexible substrate; a monocrystalline semiconductor layer formed on the flexible substrate; and a plurality of parallel nanowires extending along a crystal cleave plane in the semiconductor layer. The nanowires have a thickness and a width. The width includes an intercrack distance determined in accordance with a particular strain applied to the semiconductor layer to form the cracks. An oxide is formed between and over the nanowires to passivate and isolate adjacent nanowires. An electronic device or photonic device is formed on the nanowires.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 7A is a cross-sectional view of the flexible substrate with parallel structures formed and having illustrative devices formed with the parallel structures in accordance with the present principles;

FIG. 7B is a top down view showing the flexible substrate with parallel structures formed and having the illustrative devices formed with the parallel structures in accordance with the present principles;

FIG. 8A is a cross-sectional view of the flexible substrate with dot structures formed and having illustrative devices formed with the dot structures in accordance with the present principles;

FIG. 8B is a top down view showing the flexible substrate with dot structures formed and having the illustrative devices formed with the dot structures in accordance with the present principles.

DETAILED DESCRIPTION OF PREFERRED EMBODIMENTS

Figure 2:
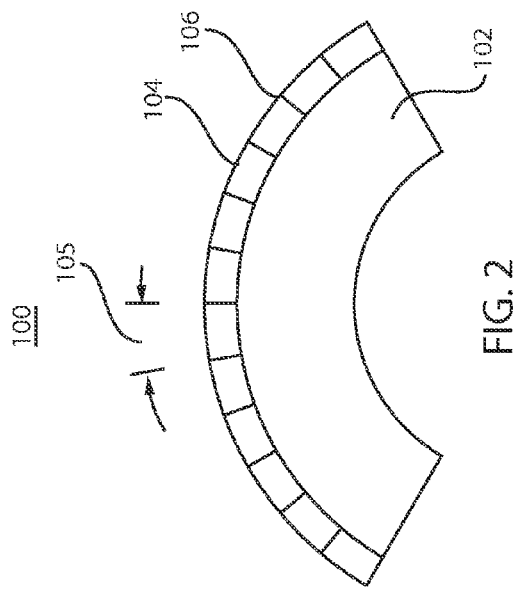
FIG. 2 is a cross-sectional view of the flexible substrate in bending to create and propagate cracks in the semiconductor layer in accordance with the present principles.

In accordance with the present principles, methods for forming nanostructures (e.g., wires, dots, etc.) using a stress-inducing manipulation of semiconductor materials are provided. The term nanostructures will be employed throughout this disclosure to include nanowires and nanodots. It should be understood that while the prefix nano will be employed to designate nano-sized dimensions, structures having sizes in the micron range (micro-sized) are also contemplated in accordance with the present principles.

In particularly useful embodiments, a semiconductor layer is applied to a flexible substrate and flexed to produce micro cracks along crystal lines. The micro cracks are propagated through the materials to cause the semiconductor layer to separate from other sections of the semiconductor layer. By controlling the bending and therefore the stress along the crystal line in the semiconductor materials, fine lines of semiconductor material can be produced. The fine lines of the semiconductor material form nanowires along the flexible substrate. These nanowires may be employed in forming a plurality of different electrical/electronic structures. In one embodiment, a dielectric layer may be deposited to provide electrical isolation between the nanowires. In other embodiments, the flexible substrate may be flexed in two orthogonal (or transvers) planes to cause the formation of islands or nanodots on the flexible substrate.

In another embodiment, temperature differences may be employed to form or propagate cracks; e.g., ultra low temperatures (e.g., cryogenic temperatures) or high temperatures may be employed to facilitate crack initiation and increase crack density.

It is to be understood that the present invention will be described in terms of a given illustrative architecture having a substrate or flexible substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments in accordance with the present principles may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw form (that is, as a single flexible substrate that has multiple structures formed thereon), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The nanowires and quantum dot embodiments as described herein may be employed in a plurality of applications and structures. For example, the present structures may be employed in devices to provide quasi one-dimensional effects (electron or photon confinement) (quantum dots) and/or provide a large ratio of surface area to volume. The nanowire/nanodot semiconductor layer is less constrained as a substrate than for device fabrication compared to bulk or thin film materials and is suitable for flexible electronics and photonics designs. The present principles find utility in devices such as, tri-gate transistors, high-gain photodetectors, various sensors with high sensitivity, infra-red detectors using intersub-band transition, photo-emitters and lasers with extremely small footprints, nanogenerators for self-powered systems, etc.

Figure 1:
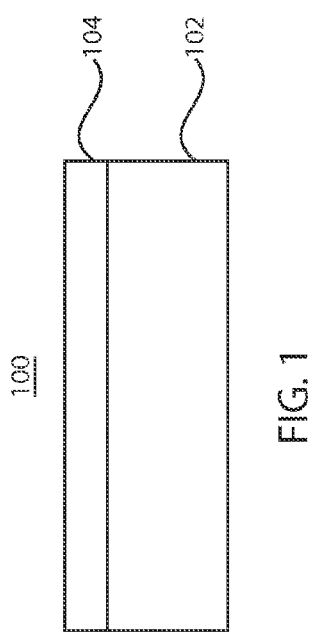
FIG. 1 is a cross-sectional view of a flexible substrate having a semiconductor layer formed thereon in accordance with the present principles.

Referring now to the drawings in which like numerals represent the same or similar elements and initially to FIG. 1, a structure 100 is shown in accordance with one illustrative embodiment. Structure 100 includes a flexible substrate 102. The flexible substrate may include a polymeric material(s), such as, e.g., thermoplastics, e.g., polyethylene terephthalate (PET), polyimide, etc.; reinforced epoxy resins, such as e.g., prepreg boards, etc. The flexible substrate 102 preferably includes elastic properties to permit full recovery during bending in accordance with the present principles. A semiconductor layer 104 is provided on the flexible substrate 102. The semiconductor layer 104 preferably includes a monocrystalline form of a semiconductor material. In one embodiment, the semiconductor material includes Si, although other crystalline materials may be employed, such as Ge, GaAs, etc. For purposes of this disclosure, the present principles will be described in terms of monocrystalline Si. In one illustrative embodiment, the flexible substrate 102 may include a thickness of between about 0.1 mm and 10 mm. The semiconductor layer 104 may include a thickness of between about 1 nm and about 1000 nm.

The semiconductor layer 104 may be deposited on the flexible substrate 102 using epitaxial growth or the semiconductor layer 104 may be bonded to the flexible substrate using an adhesive. In other embodiments, additional layers may be employed between the flexible substrate 102 and the semiconductor layer 104. The flexible substrate 102 and the semiconductor layer 104 are formed or provided having determined thicknesses to assist in achieving desired bending stress/strain in the next steps.

Referring to FIG. 2, the flexible substrate 102 with the semiconductor layer 104 formed thereon is bent in a two point bending process. The two point bending flexes the device 100 about a single axis of rotation. This can be performed using a fixture or may include applying the device over a radiused surface. The bending radius and the thicknesses of the layers 102, 104 may be guided by beam theory computations to ensure sufficient strain is provided along crystal lines. In one embodiment, the semiconductor layer 104 is positioned to have a "110" crystal plane aligned to an axis of bending. In one embodiment, a machine chuck is employed to clamp two edges which can have a torque applied to cause bending.

In one embodiment, uniaxial tensile strain is induced to initiate and propagate cracking in the single crystalline semiconductor layer 104. For example, cracking occurs along a Si cleavage plane 110. An intercrack distance 105 is proportional to the amount of tensile strain occurring in the bent semiconductor layer 104. Cracks 106 in a nanoscale thick Si film can be self-formed when tensile strain is high enough to form cracks 106 with a nanometer scale inter-crack distance 105. For semiconductor layer 104, a thickness can be provided, e.g., between about 20 nm to about 900 nm, and a uniaxial strain can be computed such that the intercrack distance 105 provides a second dimension (width) for nanowires 112 formed by the bending. If the width dimension that is desired is to be close to the thickness dimension selected, a bending moment is selected to provide a uniaxial strain that will yield the desired intercrack distance 105 to achieve the width of the nanowires 112.

The uniaxial tensile strain is applied by two-point bending of the flexible substrate 102 until cracks located at the intercrack distance 105 propagate through the thickness of the semiconductor layer 104. The crack propagation may be assisted by various mechanisms once cracks 106 are initiated. For example, cracks 106 may be accelerated by changing temperatures, employing vibration, increasing strain, etc.

In another embodiment, in addition to or instead of bending, the substrate 102 and layer 104 are subjected to rapid temperature changes to cause expansion or contraction to induce cracking. The temperature changes may be induced using, e.g., cryogenic cooling, flash heating or combinations thereof.

Figure 3B:
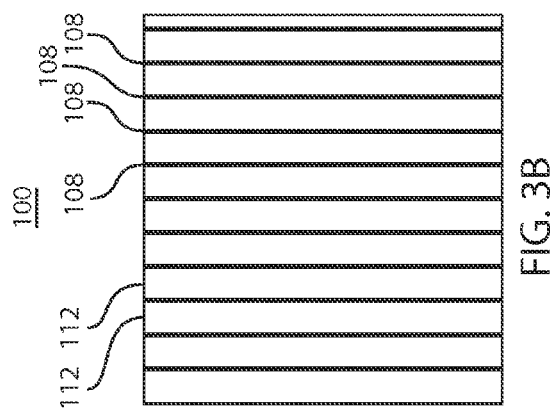
FIG. 3B is a top down view showing the flexible substrate with parallel structures formed and having a transparent dielectric material formed over the parallel structures for ease of viewing the parallel structures in accordance with the present principles.
Figure 3A:
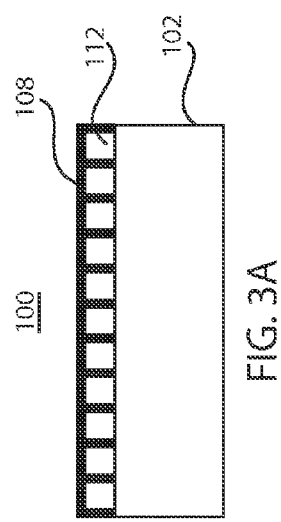
FIG. 3A is a cross-sectional view of the flexible substrate with parallel structures formed and having dielectric materials formed over and in-between the parallel structures in accordance with the present principles.

Referring to FIG. 3A, a cross-sectional view of the device 100 is shown in accordance with one embodiment. After crack formation and propagation through the semiconductor layer 104, stress/strain is released from the device. Depending on how the device 100 will be employed, a dielectric material 108 may be deposited over the semiconductor layer 104. The dielectric material 108 may include, e.g., an oxide, such as silicon dioxide, a nitride, such as silicon nitride, silicon oxynitride, etc. In one example, a natural oxide may be formed as a dielectric material 108 by oxidizing the surface of the semiconductor layer 104. In other examples, a chemical vapor deposition or similar deposition process may be employed to form dielectric material 108.

In one embodiment, prior to forming the dielectric material 108, an etching process may be performed to increase the width of the cracks (106) between nanowires 112 to control the width of nanowires 112 and ensure the dielectric material 108 electrically isolates adjacent nanowires 112. The etching process may include a wet etch, using a diluted acid, e.g., HF, HCl, etc. In one embodiment, the flexible substrate 102 may be mounted permanently or temporarily on an additional rigid substrate (not shown) for stability during processing or operation.

Referring to FIG. 3B, a top down view is shown for the structure in FIG. 3A with the dielectric layer 108 on top appearing transparent to view the underlying nanowires 112. The nanowires 112 extend along the entire device 100 in a crystal direction (e.g., 110 in Si). The nanowires 112 are high-density defect-free and aligned along the crystal direction (e.g., 110 in Si).

It should be understood that the semiconductor layer 104 may be doped during formation or after formation either before or after crack inducement. It should also be understood that different portions of the semiconductor layer 104 may be doped differently depending on the specific applications of the nanowires 112. This may be achieved by forming masks on the surface of the semiconductor layer 104 and doping exposed areas. The dielectric material 108 may be formed after doping the semiconductor layer 104 or the nanowires 112.

Processing may continue, which employs the unique nature of the nanowires 112 formed in accordance with the present principles. The nanowires 112 may be employed to form transistor devices, capacitors, electric wires, photosensitive devices, biosensors, wrap-around multi-channel transistors, etc. It should be understood that parts of the nanowires 112 may be etched away to create nanowires less than a full length of the device 100. In this way, nanowires 112 may be employed locally to form devices in isolation of other devices downstream along the same semiconductor crystal direction (e.g., 110).

Figure 4:
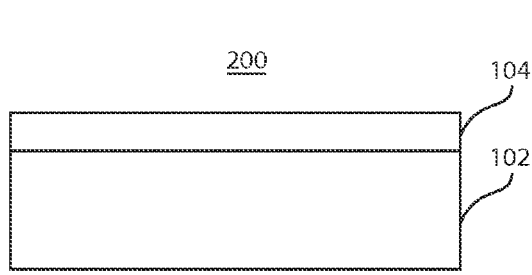
FIG. 4 is a cross-sectional view of another flexible substrate having a semiconductor layer formed thereon in accordance with the present principles.

Referring to FIG. 4, a structure 200 is shown in accordance with another illustrative embodiment. Structure 200 includes the flexible substrate 102, and the semiconductor layer 104 as described above.

Figure 5A:
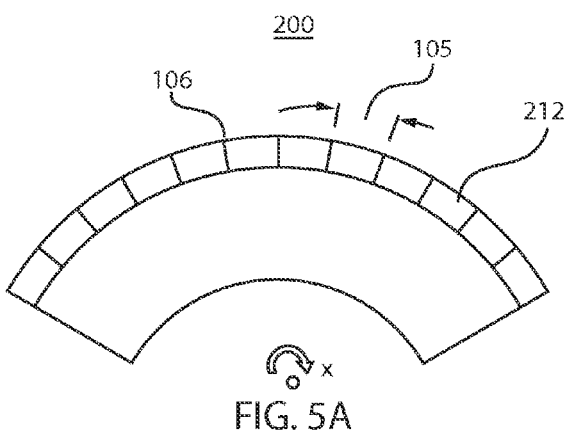
FIG. 5A is a cross-sectional view of the flexible substrate in bending along one axis to create and propagate cracks in the semiconductor layer in accordance with the present principles.

Referring to FIG. 5A, the flexible substrate 102 with the semiconductor layer 104 formed thereon is bent in a first two point bending process similar to the process described with the respect to FIG. 2. The two point bending flexes the device 200 about a single axis of rotation, which will be arbitrarily designated as the x-axis ("x"). This can be performed using a fixture or may include applying the device 200 over a radiused surface. The bending radius and the thicknesses of the layers 102, 104 may be guided by beam theory computations to ensure sufficient strain is provided along crystal lines. In one embodiment, the semiconductor layer 104 is positioned to have a "100" crystal plane aligned to an axis of bending.

In one embodiment, uniaxial tensile strain is induced to initiate and propagate cracking in the single crystalline semiconductor layer 104, as before. For example, cracking occurs along a Si cleavage plane "100". An intercrack distance 105 is proportional to the amount of tensile strain occurring in the bent semiconductor layer 104. Cracks 106 in a nanoscale thick Si film can be self-formed when tensile strain is high enough to form cracks 106 with a nanometer scale inter-crack distance 105. For semiconductor layer 104, a thickness can be provided, e.g., between about 20 nm to about 900 nm, and a uniaxial strain can be computed such that the intercrack distance 105 provides a second dimension (width) for nanowires 212 formed by the bending. If the width dimension that is desired is to be close to the thickness dimension selected, a bending moment is selected to provide a uniaxial strain that will yield the desired intercrack distance 105 to achieve this width of the nanowires 112.

The uniaxial tensile strain is applied by two-point bending of the flexible substrate 102 until cracks located at the intercrack distance 105 propagate through the thickness of the semiconductor layer 104. The crack propagation may be assisted by various mechanisms once cracks 106 are initiated. For example, cracks 106 may be accelerated by changing temperatures, vibrations, increasing strain, etc.

Figure 5B:
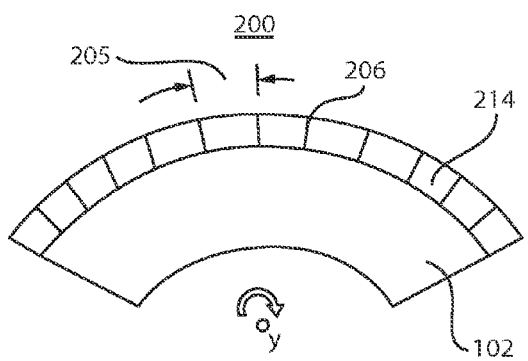
FIG. 5B is a cross-sectional view of the flexible substrate in bending along a second axis to create and propagate cracks in the semiconductor layer in accordance with the present principles.

Referring to FIG. 5B, the flexible substrate 102 with the semiconductor layer 104 formed thereon is bent in a second two point bending process similar to the process described with the respect to FIG. 5A. The two point bending flexes the device 200 about a second axis of rotation, which will be designated as the y-axis ("y") and is orthogonal to the x-axis. This can be performed using a fixture or may include applying the device 200 over a radiused surface. The bending radius and the thicknesses of the layers 102, 104 may be guided by beam theory computations to ensure sufficient strain is provided along crystal lines. In one embodiment, the semiconductor layer 104 is positioned to have nanowires 212 or nanodots 214 correspond to, e.g., a "001" or "010" crystal plane aligned with an axis ("y") of bending.

In one embodiment, uniaxial tensile strain is induced to initiate and propagate cracking in the single crystalline semiconductor layer 104. For example, cracking occurs along a Si cleavage plane "001" or "010", if the original cleave plane (FIG. 5A) is "110". Note that the cleave planes are orthogonal between FIGS. 5A and 5B. Other transverse relationships between cleave planes may be provided and employed as needed. An intercrack distance 205 is proportional to the amount of tensile strain occurring in the bent semiconductor layer 104 in the second bending process. Cracks 206 in a nanoscale thick Si film can be self-formed when tensile strain is high enough to form cracks 206 with the nanometer scale inter-crack distance 205. For semiconductor layer 104, a thickness, width and length are now provided for nanodots, or quantum dots 214. A uniaxial strain can be computed such that the intercrack distance 205 provides a third dimension (length) for nanodots 214 formed by the bending.

The uniaxial tensile strain may be applied by a four-point bending step where the bend axes (e.g., x and y) are applied concurrently on the flexible substrate 102 until cracks located at the intercrack distances 105 and 205 propagate through the thickness of the semiconductor layer 104. The crack propagation may be assisted by various mechanisms once cracks 106 and 206 are initiated. For example, cracks 106 and 206 may be accelerated by changing temperatures, employing vibration, increasing strain, etc.

Figure 6A:
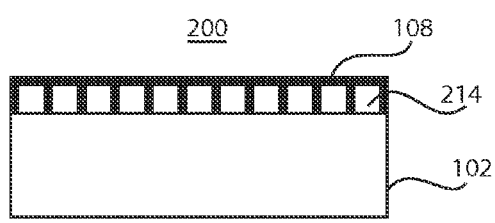
FIG. 6A is a cross-sectional view of the flexible substrate with dot structures formed in a grid pattern and having dielectric materials formed over and in-between the dot structures in accordance with the present principles.

Referring to FIG. 6A, a cross-sectional view of the device 200 is shown in accordance with one embodiment. After crack formation and propagation through the semiconductor layer 104, stress/strain is released from the device. Depending on how the device 200 will be employed, a dielectric material 108 may be deposited over the nanodots 214. The dielectric material 108 may include, e.g., an oxide, such as silicon dioxide, a nitride, such as silicon nitride, silicon oxynitride, etc. In one example, a natural oxide may be formed as a dielectric material 108 by oxidizing the surface of the nanodots 214. In other examples, a chemical vapor deposition or similar deposition process may be employed to form dielectric material 108.

In one embodiment, prior to forming the dielectric material 108, an etching process may be performed to increase the width of the cracks (106, 206) between nanodots 214 to ensure the dielectric material 108 electrically isolates adjacent nanodots 214 and provides appropriate spacing between the dots 214. The etching process may include a wet etch, using a diluted acid, e.g., HF, HCl, etc.

Figure 6B:
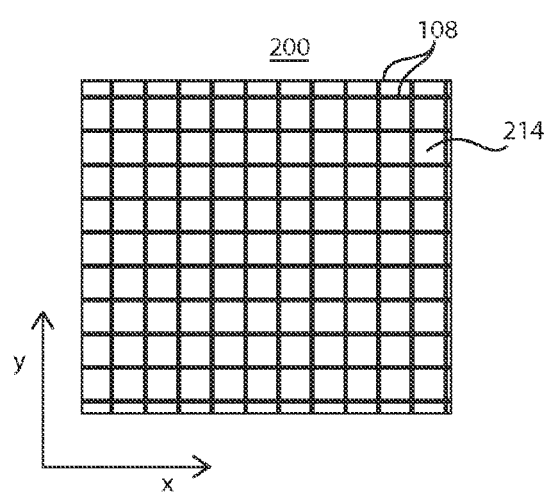
FIG. 6B is a top down view showing the flexible substrate with dot structures formed in the grid pattern and having a transparent dielectric material formed over the dot structures for ease of viewing the dot structures in accordance with the present principles.

Referring to FIG. 6B, a top down view is shown for the structure in FIG. 6A with the dielectric layer 108 on top appearing transparent to view the underlying nanodots 214. The nanodots 214 include edges that extend along two different crystallographic directions. These different directions may be orthogonal but may include other configurations, e.g., two of the 100, 011, 010, 001, 011, etc. crystal directions may be employed. The nanodots 214 are high-density defect-free and aligned along the two crystal directions, and may be employed to form a quantum dot array. The array may be employed in providing photonic crystals, an array of nanoscale photo-emitters or lasers, etc.

It should be understood that the semiconductor layer 104 may be doped during formation or after formation either before or after crack inducement. It should also be understood that different portions of the semiconductor layer 104 may be doped differently depending on the specific applications of the nanodots 214. This may be achieved by forming masks on the surface of the semiconductor layer 104 and doping exposed areas. The dielectric material 108 may be formed after doping the semiconductor layer 104 or nanodots 214.

Processing may continue which employs the unique nature of the nanodots 214 formed in accordance with the present principles. The nanodots 214 may be employed to form quantum confinement structures, transistor devices, capacitors, photosensitive devices, biosensors, etc. It should be understood that the nanodots 214 may be etched away to create spaces between nanodots (e.g., a checkerboard pattern, etc.).

Referring to FIGS. 7A and 7B, illustrative devices are depicted in accordance with the present principles where FIG. 7A depicts a cross-sectional view and FIG. 7B depicts a top view with dielectric material being transparent to view underlying materials. A device 150 is formed with multiple nanowires 112 and may include a transistor device or the like. A longitudinal element 160 is formed over or with a single nanowire 112. This may include a capacitive element, a contact, etc.

Referring to FIGS. 8A and 8B, illustrative devices are depicted in accordance with the present principles where FIG. 8A depicts a cross-sectional view and FIG. 8B depicts a top view with dielectric material being transparent to view underlying materials. A device 170 is formed with nanodots 214 and employs contacts 172 and 174 to connect to the device 170. Note that devices 150, 160 and 170 depict illustrative uses of the devices in accordance with the present principles. These devices 150, 160 and 170 should not be considered as limiting as other devices and structures are also contemplated.

Figure 9:
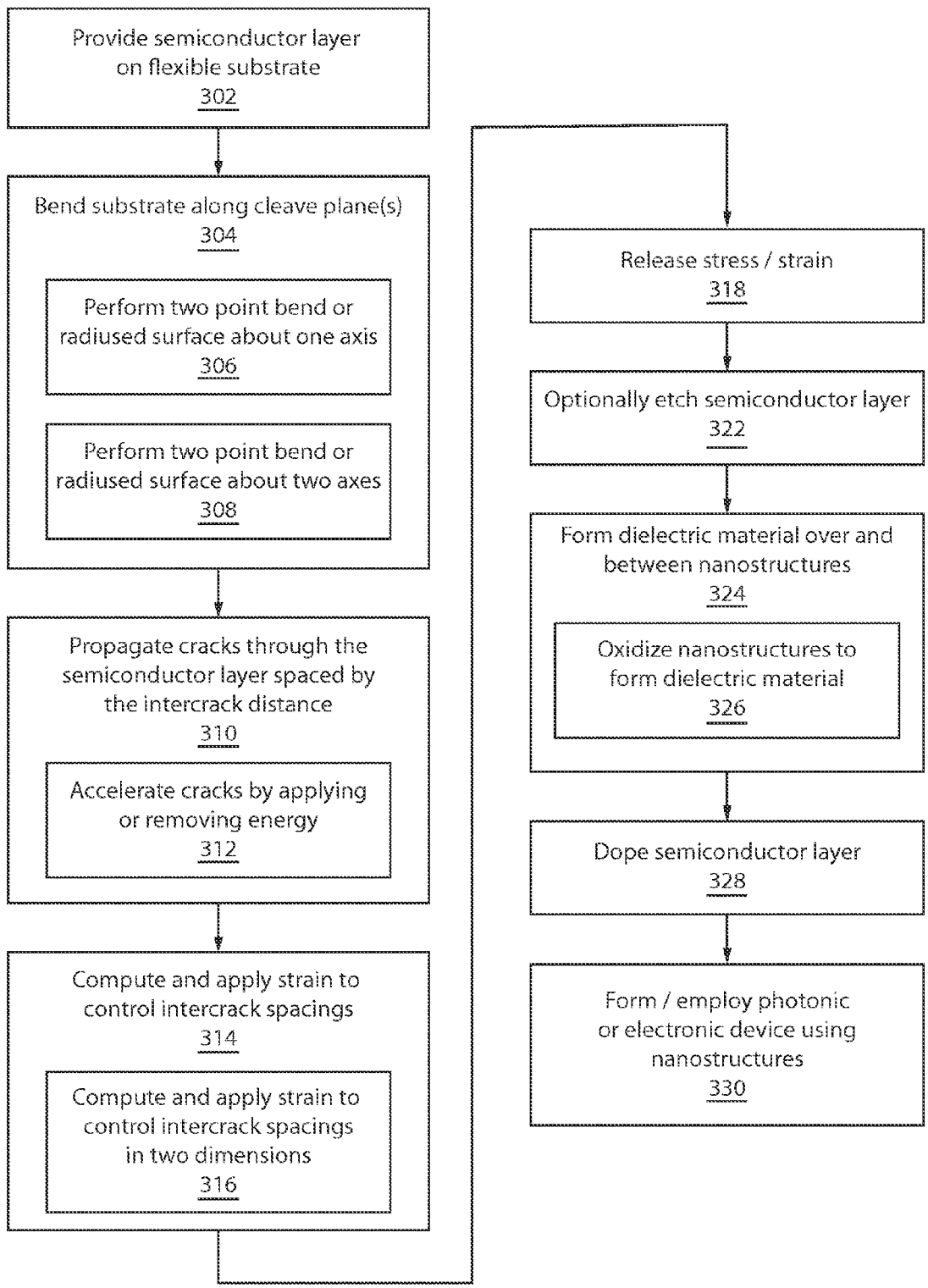
FIG. 9 is a block/flow diagram showing methods for forming nanostructures in accordance with illustrative embodiments.

Referring to FIG. 9, methods for forming nanostructures (e.g., wires or dots) are illustratively shown in accordance with exemplary embodiments. It should also be noted that, in some alternative implementations, the functions noted in the blocks may occur out of the order noted in the figure(s). For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 302, a monocrystalline semiconductor layer is provided or formed on a flexible substrate. The semiconductor layer may include monocrystalline silicon.

In block 304, the substrate is bent in accordance with one or more crystal cleave planes of the semiconductor layer to provide a strain in the semiconductor layer. It should be noted that other mechanisms may be employed for inducing cracks, for example, cooling or heating may be employed. In block 306, bending the substrate includes bending the substrate using a two point bend or over a radiused surface. In block 308, bending the substrate may include bending the substrate in accordance with a first crystal cleave plane to provide a first strain in the semiconductor layer and in accordance with a second crystal cleave plane to provide a second strain in the semiconductor layer. The bending may be carried out separately (e.g., two, two-point bending operations) or concurrently (one, four-point bending operation).

In block 310, cracks are propagated on the crystal cleave plane(s) through the semiconductor layer where the cracks are spaced by an intercrack distance as determined by applying a particular strain. In block 312, propagating cracks may be accelerated by applying or removing energy, e.g., one or more of a temperature change, vibration, increased stress, etc., to the semiconductor layer. In one embodiment, in addition to or instead of bending, the substrate and semiconductor layer are subjected to rapid temperature changes to cause expansion or contraction to induce cracking. The temperature changes may be induced using, e.g., cryogenic cooling, flash heating or combinations thereof.

In block 314, a strain corresponding with an intercrack distance may be computed and applied to provide and control a dimension or dimensions for the nanostructures that is equal to the intercrack distance. In block 316, the strain corresponding with an intercrack distance may be computed for two cleave planes and applied to provide dimensions for dot structures that are equal to the intercrack distance in two dimensions.

In block 318, the strain is released to provide parallel structures or dots on the flexible substrate. In block 322, the nanostructures may optionally be etched prior to forming a dielectric material.

In block 324, a dielectric material is formed over the nanostructures and in between the nanostructures to ensure electrical isolation between adjacent structures. In block 326, the dielectric material may include oxidizing the nanostructures to form a passivation layer to isolate and maintain a gap between adjacent structures.

In block 328, the semiconductor layer may be doped. The doping may be performed at any time during the fabrication process, e.g., in-situ during formation of the semiconductor layer, after formation, etc. In block 330, the nanostructures are employed in an electronic or photonic device, or the electronic or photonic is formed on or using the nano structures.

Having described preferred embodiments for self-formation of high-density defect-free and aligned nanowires (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A nanostructure device, comprising:
a flexible substrate;
a monocrystalline semiconductor layer formed on the flexible substrate;
a plurality of parallel cracks formed in accordance with a crystal cleave plane in the semiconductor layer, the cracks being spaced apart by an intercrack distance as determined by applying a particular strain to form parallel structures; and
a dielectric material formed in the cracks between and over the parallel structures on the semiconductor layer.

2. The device as recited in claim 1, wherein parallel structures include nanowires.

3. The device as recited in claim 1, wherein the cracks extend through an entire thickness of the semiconductor layer.

4. The device as recited in claim 1, wherein a dimension for the parallel structures is determined by the intercrack distance.

5. The device as recited in claim 1, wherein the parallel structures are doped to change conductivity.

6. The device as recited in claim 1, further comprising an electronic or photonic device formed on the parallel structures.

7. The device as recited in claim 1, wherein the dielectric material includes an oxide of the semiconductor layer.

8. The device as recited in claim 1, wherein the semiconductor layer includes monocrystalline silicon.

9. The device as recited in claim 1, wherein the flexible substrate includes a polymeric material.

10. A nanostructure device, comprising:
a flexible substrate;
a monocrystalline semiconductor layer formed on the flexible substrate;
a plurality of parallel cracks formed in accordance with two crystal cleave planes in the semiconductor layer, the cracks being spaced apart by intercrack distances in two dimensions as determined by applying a particular strain to form dot structures; and
a dielectric material formed in the cracks between and over the dot structures on the semiconductor layer.

11. The device as recited in claim 10, wherein dot structures include nanodots or quantum dots.

12. The device as recited in claim 10, wherein the cracks extend through an entire thickness of the semiconductor layer.

13. The device as recited in claim 10, wherein a width and a length of each dot is determined by the intercrack distances in the two dimensions.

14. The device as recited in claim 10, wherein the dot structures are doped to change conductivity.

15. The device as recited in claim 10, further comprising an electronic or photonic device formed with the dot structures.

16. The device as recited in claim 10, wherein the dielectric material includes an oxide of the semiconductor layer.

17. The device as recited in claim 10, wherein the semiconductor layer includes monocrystalline silicon.

18. The device as recited in claim 10, wherein the flexible substrate includes a polymeric material.

19. A nanostructure device, comprising:
 a flexible substrate;
 a monocrystalline semiconductor layer formed on the flexible substrate;
 a plurality of parallel nanowires extending along a crystal cleave plane in the semiconductor layer, the nanowires having a thickness and a width, the width including an intercrack distance determined in accordance with a particular strain applied to the semiconductor layer to form the cracks;
 an oxide formed between and over the nanowires to passivate and isolate adjacent nanowires; and
 an electronic device or photonic device formed on the nanowires.

20. The device as recited in claim 19, wherein the plurality of parallel nanowires are cracked along a second crystal cleave plane in the semiconductor layer to form dot structures.

21. The device as recited in claim 19, wherein the nanowires are doped to change conductivity.

22. The device as recited in claim 19, wherein the semiconductor layer includes monocrystalline silicon and the flexible substrate includes a polymeric material.

* * * * *